United States Patent
Iguchi et al.

(10) Patent No.: US 11,264,240 B2
(45) Date of Patent: Mar. 1, 2022

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventors: Kenichi Iguchi, Nagano (JP); Haruo Nakazawa, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 54 days.

(21) Appl. No.: 16/528,959

(22) Filed: Aug. 1, 2019

(65) Prior Publication Data
US 2020/0066528 A1    Feb. 27, 2020

(30) Foreign Application Priority Data

Aug. 27, 2018  (JP) .............................. JP2018-158706

(51) Int. Cl.
| | |
|---|---|
| H01L 29/868 | (2006.01) |
| H01L 29/16 | (2006.01) |
| H01L 21/04 | (2006.01) |
| H01L 29/78 | (2006.01) |
| H01L 21/268 | (2006.01) |

(52) U.S. Cl.
CPC .......... *H01L 21/046* (2013.01); *H01L 21/268* (2013.01); *H01L 29/1608* (2013.01); *H01L 29/7806* (2013.01); *H01L 21/0485* (2013.01); *H01L 21/0495* (2013.01)

(58) Field of Classification Search
CPC ............. H01L 29/1608; H01L 29/6606; H01L 21/0485; H01L 29/167; H01L 29/36
See application file for complete search history.

(56) References Cited

U.S. PATENT DOCUMENTS

| | | | |
|---|---|---|---|
| 10,381,491 B1* | 8/2019 | Shimizu | .............. H01L 29/1608 |
| 2007/0210316 A1 | 9/2007 | Yonezawa et al. | |
| 2012/0119225 A1 | 5/2012 | Shiomi et al. | |
| 2014/0284619 A1* | 9/2014 | Nishio | .............. H01L 21/02576 |
| | | | 257/77 |

(Continued)

FOREIGN PATENT DOCUMENTS

| | | |
|---|---|---|
| JP | 2007-243080 A | 9/2007 |
| JP | 2010-205824 A | 9/2010 |

(Continued)

*Primary Examiner* — Bradley Smith
*Assistant Examiner* — David J Goodwin
(74) *Attorney, Agent, or Firm* — Chen Yoshimura LLP

(57) ABSTRACT

A semiconductor device is manufactured by implanting impurity ions in one surface of a semiconductor substrate made of silicon carbide; irradiating a region of the semiconductor substrate implanted with the impurity ions with laser light of a wavelength in the ultraviolet region; and forming, on a surface of a high-concentration impurity layer formed by irradiating with the laser light, an electrode made of metal in ohmic contact with the high-concentration impurity layer. When irradiating with the laser light, a first concentration peak of the impurity ions that exceeds a solubility limit concentration of the impurity ions in silicon carbide is formed in a surface region near the one surface of the semiconductor substrate within the high-concentration impurity layer.

16 Claims, 8 Drawing Sheets

(56) References Cited

U.S. PATENT DOCUMENTS

| | | | |
|---|---|---|---|
| 2014/0284623 A1* | 9/2014 | Ota | H01L 29/7802 257/77 |
| 2018/0174840 A1* | 6/2018 | Joshi | H01L 29/42304 |
| 2019/0362972 A1* | 11/2019 | Schulze | H01L 21/7806 |
| 2020/0066528 A1* | 2/2020 | Iguchi | H01L 29/417 |

FOREIGN PATENT DOCUMENTS

| | | |
|---|---|---|
| JP | 2016-051737 A | 4/2016 |
| WO | 2011/155234 A1 | 12/2011 |

\* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing that semiconductor device.

Background Art

Conventionally, when forming a metal electrode on an Si substrate made primarily of silicon (Si) as a semiconductor substrate, impurity ions are implanted in the Si substrate, and then a metal layer is formed on a high-concentration impurity layer formed by performing a heat treatment such as annealing. This approach achieves ohmic contact between the high-concentration impurity layer and the metal layer. Meanwhile, when using an SiC substrate made primarily of silicon carbide (SiC) as the semiconductor substrate, a high-concentration impurity layer can be formed by implanting impurity ions in the SiC substrate and then annealing at a high temperature of at least 1600° C. However, annealing temperatures of this magnitude exceed the melting points of materials such as Si, $SiO_2$, and Ni that are used to form semiconductor devices. Therefore, this type of high-temperature annealing is not suitable for use in steps in the latter half of a process for manufacturing semiconductor devices.

Therefore, when using an SiC substrate, a silicide layer is sometimes formed between the SiC substrate and the metal electrode to form an ohmic contact electrode. When such a silicide layer has been formed, it is possible to anneal at a temperature below the melting point of $SiO_2$. This makes it possible to perform silicide layer formation steps accompanied by annealing even in the latter half of the manufacturing process (for example, after forming a metal-oxide-semiconductor (MOS) structure on an SiC substrate).

Moreover, as described in Patent Document 1, after forming a metal layer on an SiC substrate, laser annealing can be performed locally to reduce the effects of annealing on the semiconductor material. This makes it possible to form a silicide layer by performing a heat treatment only near the regions in which the silicide layer is necessary, thereby making it possible to avoid inducing any heat-related effects on the SiC substrate or semiconductor structures as a result of heating the entire SiC substrate.

RELATED ART DOCUMENTS

Patent Documents

Patent Document 1: Japanese Patent Application Laid-Open Publication No. 2007-243080

SUMMARY OF THE INVENTION

Performing a local laser annealing process on a metal layer on an SiC substrate makes it possible to resolve the abovementioned problems that accompany atmospheric annealing. However, the rapid heating caused by laser irradiation can sometimes result in an increase in contact resistance between the SiC and metal layer. Moreover, when using local laser annealing, excess carbon (C) that cannot react with the metal during the silicide reaction sometimes precipitates out onto the SiC substrate, and this precipitated carbon can cause the metal layer to separate from the surface of the SiC substrate more easily.

The present invention was made in view of the problems described above and aims to provide a high-quality semiconductor device that can be manufactured without using complicated processes, as well as a method of manufacturing such a semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a semiconductor device, comprising implanting impurity ions in one surface of a semiconductor substrate made of silicon carbide; irradiating a region of the semiconductor substrate implanted with the impurity ions with laser light of a wavelength in an ultraviolet region to form a high-concentration impurity layer; and forming, on a surface of the high-concentration impurity layer formed by irradiating with the laser light, an electrode made of metal in ohmic contact with the high-concentration impurity layer, wherein in the step of irradiating with the laser light, a first concentration peak of the impurity ions that exceeds a solubility limit concentration of the impurity ions in silicon carbide is formed in a surface region near the one surface of the semiconductor substrate within the high-concentration impurity layer.

In another aspect, the present disclosure provides a semiconductor device that comprises: a semiconductor substrate made of silicon carbide; a drain region or collector region containing impurity ions and formed in and near one surface of the semiconductor substrate; and an electrode formed on a surface of the drain region or collector region, the electrode being made of metal and in ohmic contact with the drain region or collector region, wherein the drain region or collector region has, in a surface region formed near the one surface of the semiconductor substrate, a first concentration peak of the impurity ions that exceeds a solubility limit concentration of the impurity ions in silicon carbide.

The present invention makes it possible to provide a high-quality semiconductor device that can be manufactured without using complicated processes, as well as a method of manufacturing such a semiconductor device.

It is to be understood that both the foregoing general description and the following detailed description are exemplary and explanatory, and are intended to provide further explanation of the invention as claimed.

DETAILED DESCRIPTION OF EMBODIMENTS

Figure 1:
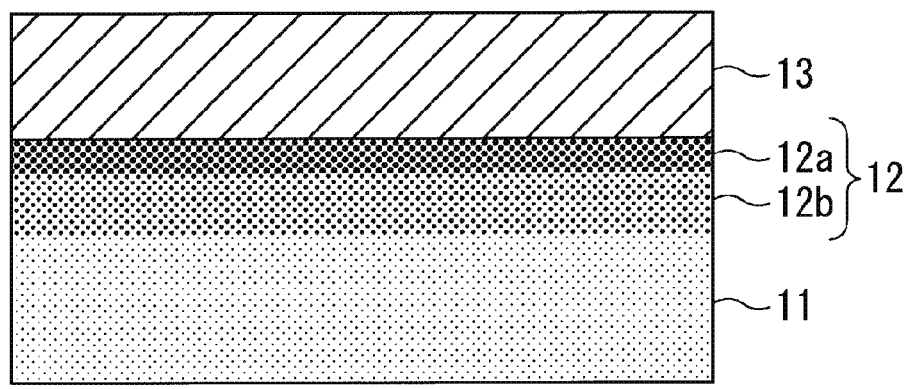
FIG. 1 is a cross-sectional view schematically illustrating an example configuration of a portion of a semiconductor device according to an embodiment of the present invention.

Next, embodiments of the present invention will be described. In the following descriptions of the drawings, the same or similar reference characters will be used for components that are the same or similar. Note, however, that the drawings are only intended to be schematic illustrations, and the relationships between thickness and planar dimensions, the proportions between the thicknesses of each device and each component, and the like may be different from in the actual devices. Therefore, specific thicknesses and dimensions should be determined by referring to the descriptions below. Similarly, the illustrated dimensional relationships and proportions of components in the figures may differ from one drawing to the next.

Moreover, in the following descriptions, the "left and right" and the "up and down" directions are defined only for the purposes of convenience and do not limit the technical concepts of the present invention in any way. Therefore, the drawings may be rotated by 90° such that the "left and right" and the "up and down" directions are interchanged, or the drawings may be rotated by 180° such that the "left" direction becomes the "right" direction and the "right" direction becomes the "left" direction, for example. Furthermore, in the present specification and attached drawings, the symbols + and − are appended to the letters n and p (which indicate conductivity type) to indicate that the corresponding semiconductor region has a higher or lower impurity concentration, respectively, than a semiconductor region for which the symbols + and − are not appended to the letters n and p. In addition, even when regions have the same notation (such as when two regions are both labeled as n$^+$), this does not necessarily imply that those regions have exactly the same impurity concentrations.

1. Structure of Semiconductor Device

Next, a semiconductor substrate, high-concentration impurity layer, and electrode for use in a semiconductor device according to an embodiment of the present invention will be described. Here, an example of manufacturing a PiN diode made primarily of SiC will be described. Note that the present invention is not limited to the embodiments described below, and the semiconductor devices according to the embodiments of the present invention can also be applied to a Schottky barrier diode (SBD), an insulated-gate field-effect transistor (metal-oxide-semiconductor field-effect transistor ((MOSFET)) such as a MISFET or MISSIT, an insulated-gate bipolar transistor (IGBT), or the like, for example. Moreover, in the semiconductor devices described below, even if the polarities of the conductivity types are inverted, the devices still remain functional and exhibit all of the same advantageous effects.

As illustrated in FIG. 1, a semiconductor device 10 according to an embodiment of the present invention includes a semiconductor substrate 11, a high-concentration impurity layer 12 formed in and near one surface of the semiconductor substrate 11, and an electrode 13 formed on a surface of the high-concentration impurity layer 12. The high-concentration impurity layer 12 is a drain region, for example, and the electrode 13 is a drain electrode, for example. Although FIG. 1 only illustrates the relationships between the semiconductor substrate 11, the high-concentration impurity layer 12, and the electrode 13, the semiconductor device 10 according to this embodiment of the present invention also includes other portions, such as impurity regions, insulating layers, and electrodes.

The semiconductor substrate 11 is a 4H-SiC semiconductor substrate made of n$^+$ silicon carbide and is a monocrystalline silicon carbide substrate doped with nitrogen (N), for example. This semiconductor substrate 11 which is made of silicon carbide has a higher dielectric breakdown field strength than a silicon (Si) substrate and is suitable for use as a substrate in power semiconductor devices. The electrode 13 is formed on the surface of the high-concentration impurity layer 12 formed in the semiconductor substrate 11, is made of a metal, and is in ohmic contact with the high-concentration impurity layer 12. Below, the semiconductor substrate 11 will sometimes be referred to as an "SiC substrate 11".

The high-concentration impurity layer 12 is an impurity ion-containing region formed in and near one surface of the SiC substrate 11. This high-concentration impurity layer 12 includes a surface region 12a formed near the surface of the high-concentration impurity layer 12 (SiC substrate 11) and a diffusion region 12b formed at a deeper position than the surface region 12a.

Figure 2:
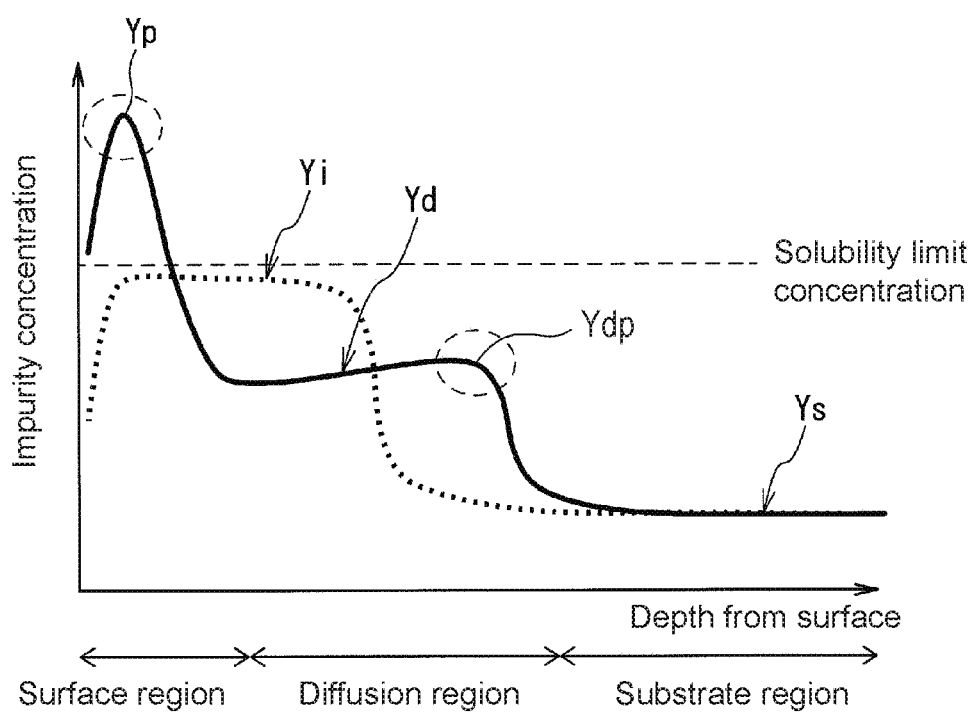
FIG. 2 is a graph illustrating the concentration profile of the concentration of impurities in the substrate thickness direction of a semiconductor substrate in the semiconductor device according to the embodiment of the present invention.

FIG. 2 is a graph showing the concentration profile of impurity ions in the SiC substrate 11 having the high-concentration impurity layer 12 formed near one surface thereof. Here, "concentration profile" refers to the so-called depth profile representing the impurity ion concentration distribution in the depth direction of the SiC substrate 11. The high-concentration impurity layer 12 has a first concentration peak of impurity ions in the surface region 12a. The impurity ion concentration (first peak concentration) Yp at this first concentration peak exceeds the solubility limit concentration of impurity ions in silicon carbide. Here, the surface region 12a refers to the region at a depth up to 100 nm from the impurity ion implantation surface of the SiC substrate 11. In other words, the first concentration peak in impurity ion concentration is formed in the region at a depth up to 100 nm from the impurity ion implantation surface of the SiC substrate 11. The high-concentration impurity layer 12 having this first concentration peak is formed by implanting impurity ions in one surface of the SiC substrate 11 and then irradiating the impurity ion-implanted region of the SiC substrate 11 with laser light of a wavelength in the ultraviolet region.

Here, "solubility limit concentration" refers to the limit concentration at which impurity ions that have been implanted in a semiconductor substrate material can then be solid-dissolved into that material with atmospheric annealing. Typically, there is a strong correlation between the impurity ion concentration of the semiconductor substrate surface and the contact resistance with the electrode, and increasing the impurity ion concentration reduces this contact resistance. However, as the impurity ion concentration in the semiconductor material approaches the solubility limit concentration, the resistance actually increases. This is thought to be a result of deformation in the crystal structure of the semiconductor material due to the impurity ions. However, by implanting impurity ions in the SiC substrate 11 and then laser annealing with a laser of a wavelength in the ultraviolet region, the impurity ion concentration near the surface of the high-concentration impurity layer 12 can be increased to beyond the solubility limit concentration, thereby reducing contact resistance.

Furthermore, the impurity ion concentration Yd of the diffusion region 12b of the high-concentration impurity layer 12 is less than the solubility limit concentration. In the concentration profile of the diffusion region 12b of the high-concentration impurity layer 12, the impurity ion concentration may decrease gradually moving in the depth direction of the SiC substrate 11 or may remain at a substantially constant concentration throughout the diffusion region 12b. Moreover, as illustrated in FIG. 2, the diffusion region 12b of the high-concentration impurity layer 12 may have a second concentration peak of impurity ions with a peak concentration Ydp. In this case, the peak concentration Ydp of the second concentration peak is less than the solubility limit concentration.

Here, the impurity ion concentration profile of the surface region 12a and the diffusion region 12b is formed by utilizing laser annealing to move impurity ions within the crystal lattice so as to change the impurity ion concentration profile from prior to laser annealing. Although impurity ions implanted into an SiC crystal exhibit substantially no diffusion when atmospheric annealing is performed, the heat and light energy of laser annealing do cause the impurity ions to diffuse.

In the SiC substrate 11, the impurity ion concentration satisfies the relationship first peak concentration Yp>solubility limit concentration>impurity ion implantation concentration Yi>diffusion concentration Yd>substrate concentration Ys. Here, the diffusion concentration Yd refers to the concentration of impurity ions in the diffusion region 12b, the substrate concentration Ys refers to the concentration of impurity ions in regions (the SiC substrate 11 region) deeper than the diffusion region 12b, and the impurity ion implantation concentration Yi refers to the concentration of impurity ions when the impurity ions are implanted into the SiC substrate 11 (prior to laser annealing).

It is preferable that the impurity ions be ions containing one or more elements selected from among nitrogen (N), phosphorus (P), aluminum (Al), boron (B), silicon (Si), carbon (C), and beryllium (Be).

When the impurity ions are nitrogen ions, it is preferable that the first peak concentration Yp of nitrogen ions in the surface region 12a be greater than or equal to $1 \times 10^{20}$ cm$^{-3}$ and that the diffusion concentration Yd of nitrogen ions in the diffusion region 12b be greater than or equal to $1 \times 10^{19}$ cm$^{-3}$. Moreover, it is preferable that the substrate concentration Ys be less than $1 \times 10^{19}$ cm$^{-3}$.

When the impurity ions are phosphorus ions, it is preferable that the first peak concentration Yp of phosphorus ions in the surface region 12a be greater than or equal to $5 \times 10^{20}$ cm$^{-3}$ and that the diffusion concentration Yd of phosphorus ions in the diffusion region 12b be greater than or equal to $5 \times 10^{19}$ cm$^{-3}$. Moreover, it is preferable that the substrate concentration Ys be less than $1 \times 10^{19}$ cm$^{-3}$.

It is preferable that this type of high-concentration impurity layer 12 be applied to the drain region of a MOS device or to the collector region of an IGBT.

2. Method of Manufacturing Semiconductor Device

Next, a method of manufacturing the semiconductor device 10 according to an embodiment of the present invention will be described with reference to FIGS. 3A to 5B.

Figure 3A:
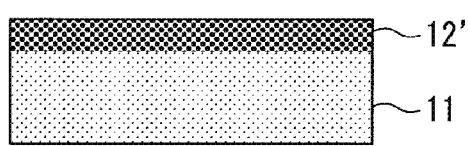
FIGS. 3A to 3E are cross-sectional process step views for explaining an example of a method of manufacturing the semiconductor device according to the embodiment of the present invention.

As illustrated in FIG. 3A, impurity ions are implanted in one surface of an SiC substrate to form an impurity implantation region 12'. At this time, impurity ions are implanted in a surface region 12a and in a diffusion region 12b that is deeper than the surface region 12a. These ions are implanted deeper than the surface region 12a that extends from a depth up to 100 nm from the surface of the SiC substrate 11 and may be implanted up to a depth of approximately 500 nm into the SiC substrate 11, for example.

The impurity ions that are implanted in the n$^+$ SiC substrate 11 may be n-type impurity ions or p-type impurity ions, and it is preferable that ions containing one or more elements selected from among nitrogen (N), phosphorus (P), aluminum (Al), boron (B), silicon (Si), carbon (C), and beryllium (Be) be used.

When nitrogen ions are used as the impurity ions, for example, the nitrogen ions are implanted such that the concentration of nitrogen ions in the region of up to a depth of 200 nm from the surface of the SiC substrate 11 is $1 \times 10^{19}$ cm$^{-3}$ to $5 \times 10^{19}$ cm$^{-3}$. Moreover, when phosphorus ions are used as the impurity ions, for example, the phosphorus ions are implanted such that the concentration of phosphorus ions in the region of up to a depth of 200 nm from the surface of the SiC substrate 11 is $1 \times 10^{20}$ cm$^{-3}$ to $3 \times 10^{20}$ cm$^{-3}$. Implanting impurity ions at these concentrations makes it possible to, after laser annealing, form the first concentration peak that exceeds the solubility limit concentration in the surface region 12a of the SiC substrate 11.

Figure 3D:
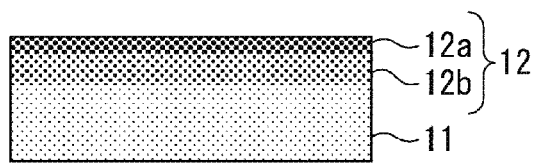
Figure 3B:
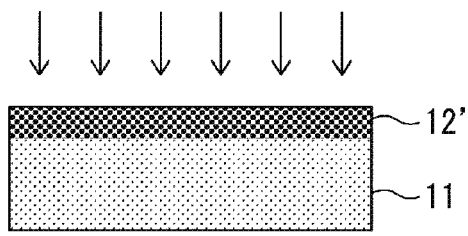

Next, as illustrated in FIG. 3B, a laser annealing process is performed by irradiating the impurity ion implantation-side surface of the SiC substrate 11 with laser light of a wavelength in the ultraviolet region. At this time, it is preferable that only the impurity ion-implanted region of the SiC substrate 11 be laser annealed. The laser light has a wavelength in the ultraviolet region, and more specifically, it is preferable that the wavelength be 190 nm to 388 nm. Moreover, it is preferable that the irradiation energy density of the laser light be 2 J/cm$^2$ to 6 J/cm$^2$ and more preferable that the irradiation energy density be 3 J/cm$^2$ to 5 J/cm$^2$. Furthermore, defining the pulse length of the laser light as the time required to attenuate the irradiation energy density to half of the peak irradiation energy density, it is preferable that the pulse length be 50 sec to 300 sec and more preferable that the pulse length be 80 sec to 200 sec.

Doing this results in formation of a first concentration peak in impurity ions that exceeds the solubility limit concentration of the impurity ions in silicon carbide in the surface region 12a near the surface of the SiC substrate 11. Here, "surface region" refers to the region at a depth up to 100 nm into the semiconductor substrate from the impurity implantation surface. When the impurity ions are nitrogen ions, irradiating with laser light makes it possible to form a high-concentration impurity layer 12 having a first peak concentration Yp of greater than or equal to $1\times10^{20}$ cm$^{-3}$. Moreover, when the impurity ions are phosphorus ions, irradiating with laser light makes it possible to form a high-concentration impurity layer 12 having a first peak concentration Yp of greater than or equal to $5\times10^{20}$ cm$^{-3}$.

Using laser light of a wavelength in the ultraviolet region as the laser light allows the laser light to reach regions deeper than the surface region 12a. This changes the impurity ion concentration profile of the surface region 12a and the diffusion region 12b that is deeper than the surface region 12a from the impurity ion concentration profile from prior to being irradiated with laser light, thereby forming the first concentration peak in impurity ions. Moreover, as illustrated in FIG. 2, a second concentration peak of impurity ions that is lower than the solubility limit concentration of the impurity ions may be formed in the diffusion region 12b.

Figure 4:
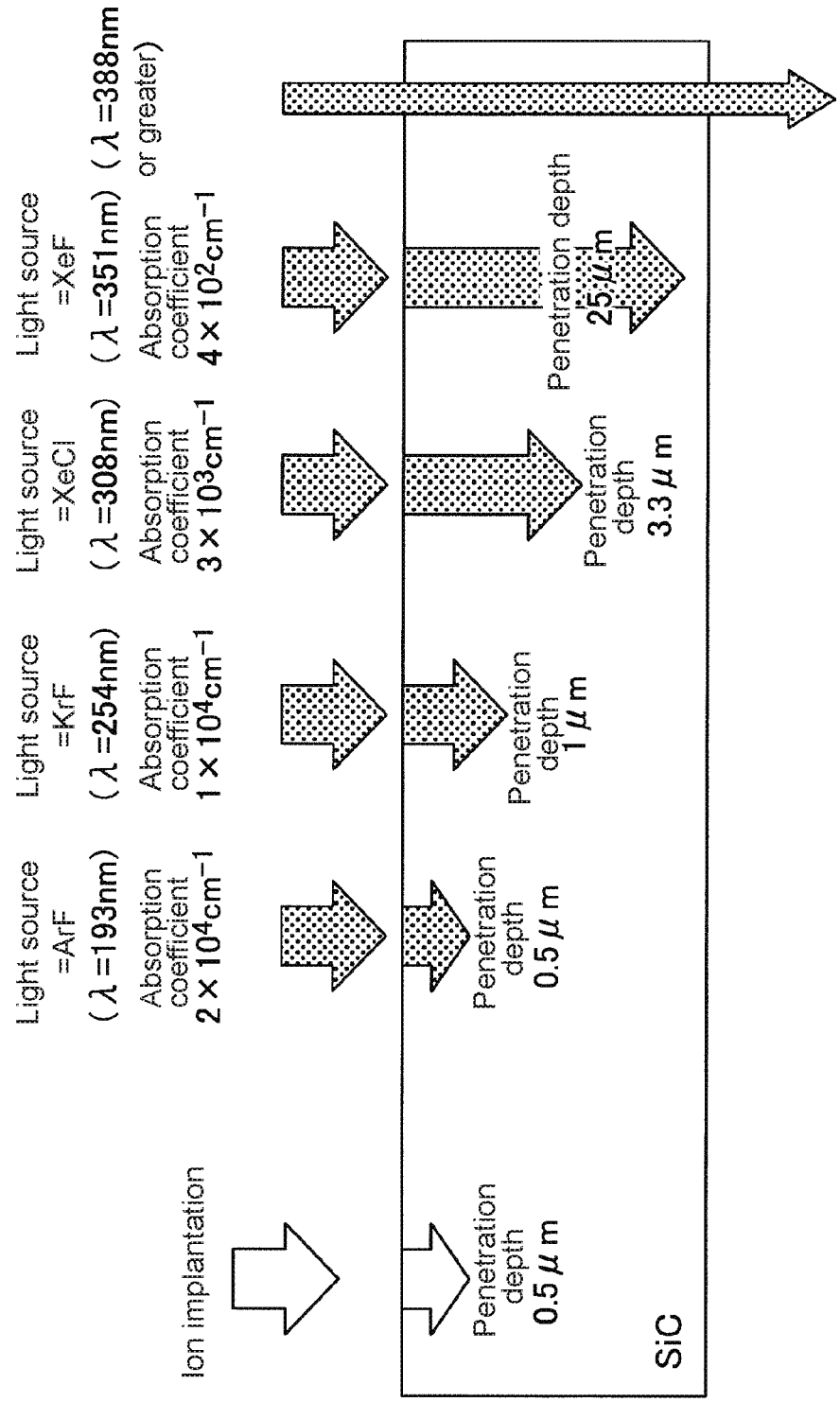
FIG. 4 is a schematic diagram for explaining how laser light is used in a method of manufacturing a semiconductor device according to an embodiment of the present invention.

As illustrated in FIG. 4, the laser light has a wavelength in the ultraviolet region. More specifically, it is preferable that the wavelength be 190 nm to 388 nm, and in order to form the high-concentration impurity layer 12 near the surface of the SiC substrate 11, it is more preferable that the wavelength be 190 nm to 308 nm. This is because increasingly short wavelengths make it possible to keep the high-temperature heat treatment process confined nearer to the surface of the SiC substrate 11. In other words, as illustrated in FIG. 4, it is preferable that ArF (wavelength=193 nm), KrF (wavelength=248 nm), XeCl (wavelength=308 nm), XeF (wavelength=351 nm), or the like be used as the laser light source, and it is more preferable that ArF, KrF, or XeCl be used.

The SiC substrate 11 has a bandgap of 3.24 eV, and therefore although laser light of a wavelength of greater than 388 nm would pass through the SiC substrate 11, the SiC substrate 11 can absorb light of a wavelength of shorter than 388 nm in the ultraviolet region. Moreover, laser light of a wavelength of less than 190 nm has a shallower penetration depth into the SiC substrate 11 than the ion implantation depth (0.5 μm) and therefore cannot sufficiently diffuse impurity ions into the SiC substrate 11 and is not preferable. Thus, irradiating the SiC substrate 11 with a laser of a wavelength in the ultraviolet region makes it possible to efficiently transmit energy to the laser irradiation region of the SiC substrate 11.

Here, the impurity ions implanted in the SiC crystal are activated and moved to the appropriate lattice sites by heat and light energy. Moreover, these impurity ions have a high energy and can therefore move and diffuse within the SiC crystal. Thus, irradiating with a laser of a wavelength in the ultraviolet region causes the impurity ions implanted in the diffusion region 12b to move towards the surface side of the SiC substrate 11, thereby changing the concentration profile and forming the first concentration peak. As a result, the concentration of impurity ions in the surface region 12a becomes greater than the concentration of impurity ions in the surface region 12a from prior to laser irradiation. Moreover, the concentration of impurity ions in the diffusion region 12b becomes less than the concentration of impurity ions in the diffusion region 12b from prior to laser irradiation. If the impurity ion concentration of the diffusion region 12b becomes less than the impurity ion concentration of the SiC substrate 11, carrier transport is impeded. Therefore, it is desirable that the impurity ion concentration change in a step by step manner, satisfying the relationship of surface region 12a>diffusion region 12b>SiC substrate 11.

Figure 3E:
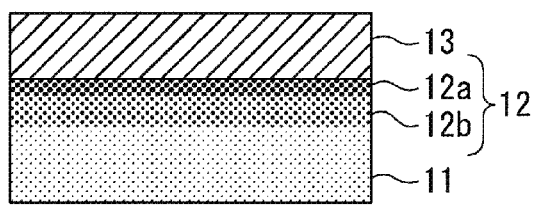
Figure 3C:
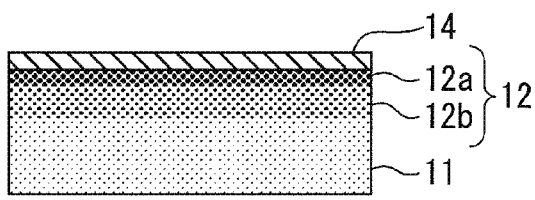

As illustrated in FIG. 3C, after forming the high-concentration impurity layer 12 by using laser annealing, carbon (C) sometimes precipitates out onto the surface of the high-concentration impurity layer 12 formed using laser annealing and forms a carbon precipitate layer 14. When this happens, as illustrated in FIG. 3D, a step of removing the carbon precipitate layer 14 is included. The carbon precipitate layer 14 can be removed using plasma ashing, polishing, or a semiconductor cleaning process such as SPM cleaning or APM cleaning, for example, although it is preferable that the carbon precipitate layer 14 be removed using plasma ashing or polishing or the like.

Finally, as illustrated in FIG. 3E, a metal layer is sputtered, for example, onto the high-concentration impurity layer 12 to form an electrode 13. The high-concentration impurity layer 12 has, in the surface region 12a, the first peak concentration of impurity ions that exceeds the solubility limit concentration, and therefore an ohmic contact is formed between the high-concentration impurity layer 12 and the electrode 13.

As described above, after implanting impurity ions in the SiC substrate 11 and irradiating with laser light having a wavelength in the ultraviolet region to form the high-concentration impurity layer 12 in the surface of the SiC substrate 11, the electrode 13 is formed on the high-concentration impurity layer 12. This makes it possible to achieve sufficient contact between the SiC substrate 11 and the electrode 13 without having to form a silicide layer between the SiC substrate 11 and the electrode 13. Next, the effects of laser annealing with laser light having a wavelength in the ultraviolet region will be described.

After implanting impurity ions in a semiconductor substrate, it is also possible to form a high-concentration impurity layer with atmospheric annealing. However, when implanting impurity ions in a semiconductor substrate, there is an impurity ion solubility limit concentration that depends on the semiconductor material. Implanting impurity ions in the semiconductor substrate in excess of this solubility limit concentration causes phenomena such as disturbance of the semiconductor crystal or precipitation of impurities to occur.

When using an Si substrate as the semiconductor substrate, even if the Si crystal temporarily melts due to high-temperature annealing, the Si substrate can be recrystallized by cooling, thereby making it possible to form a high-concentration impurity layer. However, when using an SiC substrate as the semiconductor substrate, due to the fact that SiC is a sublimable material, it is difficult to recrystallize the SiC crystal after high-temperature annealing, and once the crystal has been disturbed the material does not recrystallize. As a result, after implanting impurities in an SiC substrate and annealing to form a high-concentration impurity layer, even if a contact is formed on the high-concentration impurity layer, contact resistance tends to be high and adhesion tends to be low. Therefore, when manufacturing semiconductor devices that use SiC substrates, it is difficult to apply methods of forming high-concentration impurity layers with ion implantation and atmospheric annealing.

Furthermore, when a silicide layer is formed between an SiC substrate and an electrode using atmospheric annealing, if the annealing temperature is low, the resulting silicide reaction is insufficient and the resistance between the SiC substrate and the electrode increases. Meanwhile, if the annealing temperature is high, the SiC surface reacts (slightly) with SiO$_2$ and other metals. In a Schottky barrier diode (SBD), for example, this could cause problematic destruction of the Schottky barrier between the SiC and the Ni or Ti. Moreover, in a MOS device, the reaction between the SiC and $SiO_2$ could result in deterioration of the MOS gate and lead to threshold shift or an increase in channel resistance.

In addition, in a power device, current is conducted in the thickness direction of the semiconductor substrate. Therefore, it is desirable to reduce semiconductor substrate thickness in order to reduce resistance when conducting current. However, reducing the thickness of an SiC substrate decreases the substrate strength and can cause the substrate to warp, crack, or break due to heat stress and strain when annealing at high temperatures. One known method of avoiding this is to adhere a support substrate to the semiconductor substrate prior to high-temperature annealing during manufacture of the semiconductor device. However, this approach eliminates the possibility of annealing at temperatures exceeding the heat resistance temperature of the adhesive or support substrate.

Therefore, it is preferable that a laser be used to anneal locally. Using laser annealing eliminates the need to anneal the entire semiconductor substrate, thereby making it possible to avoid the problems described above.

Figures 5A, 5B:
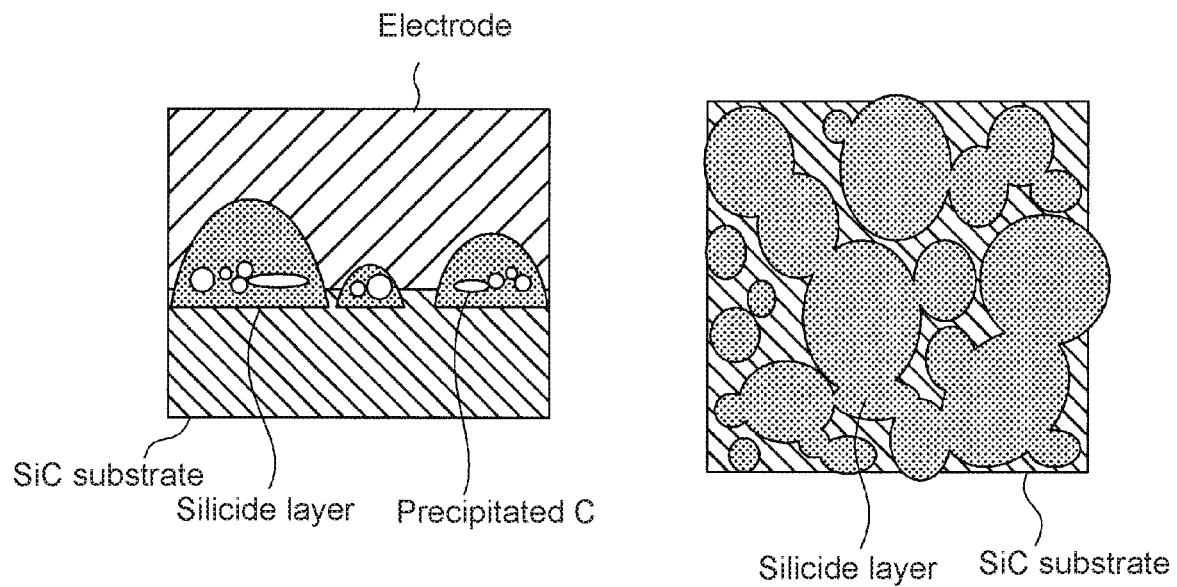
FIG. 5A is a cross-sectional view schematically illustrating an example of a semiconductor device manufactured using a conventional method of manufacturing.
FIG. 5B is a plan view schematically illustrating cross-section A-A' of the semiconductor device illustrated in FIG. 5A.

However, as illustrated in FIGS. 5A and 5B, when forming a silicide layer, the metal layer on the SiC substrate melts due to being heated rapidly by the laser annealing, and this molten metal agglomerates into an island-shaped distribution before reacting with the SiC. Here, FIG. 5A illustrates a layered section of an SiC substrate, a silicide layer, and an electrode, and FIG. 5B is a plan view of cross-section A-A' in FIG. 5A. As a result, there are some locations in which no silicide layer is formed between the SiC substrate and the metal layer, thereby decreasing the contact area between the SiC and the silicide and increasing contact resistance.

Figure 6:
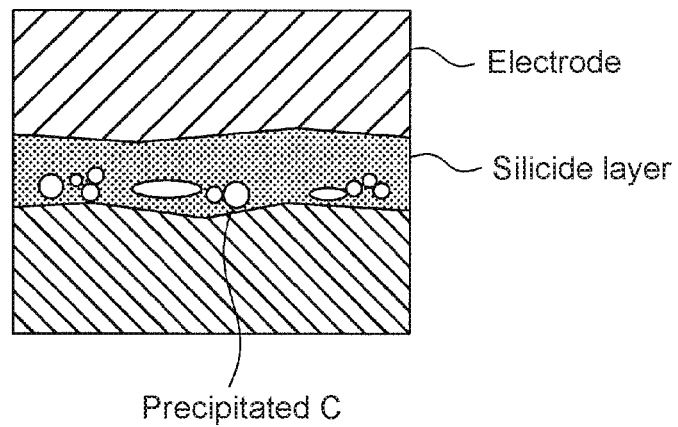
FIG. 6 is a cross-sectional view schematically illustrating an example of a semiconductor device manufactured using a conventional method of manufacturing.

Moreover, when using a silicide reaction, excess carbon that cannot react with the metal sometimes precipitates out onto the SiC substrate. As illustrated in FIG. 6, a portion of this precipitated carbon remains in a particle-shaped or layer-shaped distribution near the interface between the SiC substrate and the silicide layer. When carbon precipitates out in this manner, the bonding between the SiC and the metal is weakened, which decreases adhesion between the SiC substrate and the metal layer and can result in separation of the metal layer. In this case, removing the carbon that causes separation of the metal layer would require removing the silicide layer, and including a process for doing this would be impractical.

In light of the above, as described in this embodiment, it is preferable that after implanting impurity ions in the SiC substrate 11, the high-concentration impurity layer 12 be formed in the surface of the SiC substrate 11 by laser annealing. Laser annealing makes it possible to achieve local annealing, thereby making it possible to reduce the effects of heat on the overall SiC substrate 11 and also making it possible for the high temperatures to reliably form the high-concentration impurity layer 12 in the laser irradiation region. Moreover, by annealing locally with laser light of a wavelength in the ultraviolet region, an impurity ion concentration peak that exceeds the solubility limit concentration can be formed near the surface of the SiC substrate 11. This makes it possible to achieve contact between the SiC substrate 11 and the electrode 13 without having to form a silicide layer. Moreover, any precipitated carbon can be easily removed, which improves adhesion of the metal layer (electrode) to the SiC substrate and thereby makes it possible to prevent separation of the metal layer (electrode).

WORKING EXAMPLES

Next, semiconductor devices in which the method of manufacturing described in this embodiment is applied will be described in detail in the form of Working Examples 1 to 3.

Working Example 1

In Working Example 1, an SBD device in which a Schottky barrier diode (SBD) structure is formed on the front surface of an SiC substrate and a high-concentration impurity layer and ohmic electrode as described in the embodiment are formed on the rear surface of the SiC substrate will be described.

Figure 7:
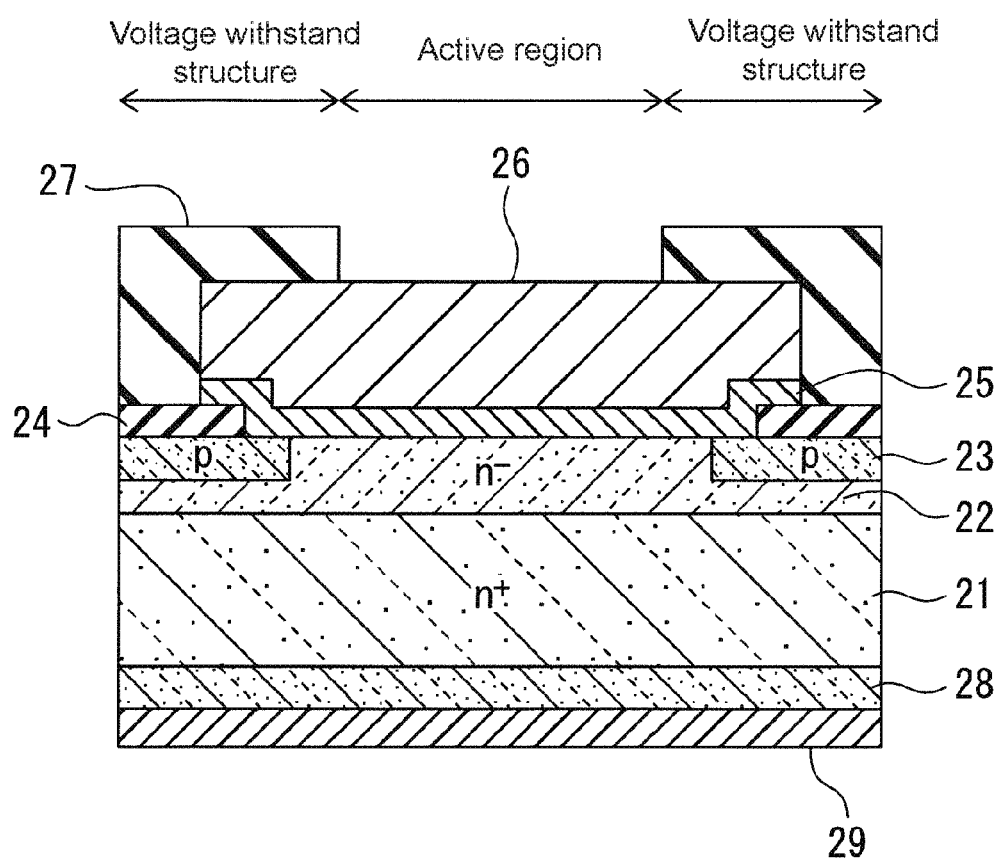
FIG. 7 is a cross-sectional view schematically illustrating an example configuration of a semiconductor device according to Working Example 1 of the present invention.

FIG. 7 is a cross-sectional view schematically illustrating the configuration of an SBD device 20, which is a semiconductor device according to Working Example 1. As illustrated in FIG. 7, the SBD device 20 of Working Example 1 includes an $n^+$ SiC substrate 21 and an n-type SiC epitaxial layer 22 deposited on one surface of the $n^+$ SiC substrate 21. The SBD device 20 further includes a ring-shaped p-type region 23 formed in the surface of the n-type SiC epitaxial layer 22 on the side opposite to the $n^+$ SiC substrate 21 side (front surface side of the SiC substrate 21), as well as an interlayer insulating film 24 formed covering the p-type region 23. Furthermore, the SBD device 20 includes a Schottky electrode 25 which forms a Schottky junction with the n-type SiC epitaxial layer 22, an electrode pad 26 formed on the Schottky electrode 25, and a protective film 27 which covers the edges of the Schottky electrode 25 and the electrode pad 26.

Next, the details of the SBD device 20 will be described while describing a method of manufacturing the SBD device 20 with reference to the cross-sectional process step views in FIGS. 8A to 8F. In FIGS. 8A to 8F, the p-type region 23, the interlayer insulating film 24, the Schottky electrode 25, the electrode pad 26, and the protective film 27 are depicted as an SBD structure 30.

Figure 8A:
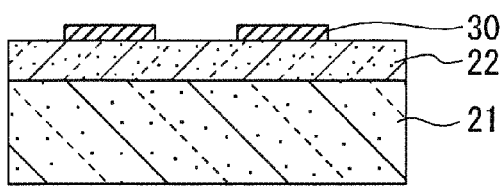
FIGS. 8A to 8F are cross-sectional views schematically illustrating an example of a method of manufacturing the semiconductor device according to Working Example 1 of the present invention.

As illustrated in FIG. 8A, an n-type SiC epitaxial layer 22 with a thickness of 10 μm is formed by being epitaxially grown on the front surface of an $n^+$ SiC substrate 21. The $n^+$ SiC substrate 21 is a monocrystalline SiC substrate doped with nitrogen (N) ions, for example, as impurity ions. The n-type SiC epitaxial layer 22 is a low impurity concentration n-type drift layer formed by doping with nitrogen, for example, to a lower impurity concentration than the $n^+$ SiC substrate 21. Below, the $n^+$ SiC substrate 21 by itself or the combination of the $n^+$ SiC substrate 21 and the n-type SiC epitaxial layer 22 will be referred to as an "SiC semiconductor substrate".

Next, the SBD structure 30 is formed on the n-type SiC epitaxial layer 22. As illustrated in FIG. 7, a ring-shaped p-type region 23 is formed in the surface of the n-type SiC epitaxial layer 22 on the side opposite to the $n^+$ SiC substrate 21 side (front surface side of the SiC substrate 21). The p-type region 23 is formed by implanting Al ions as p-type impurities. Note here that a $p^-$ region may be formed on the outer peripheral side of the p-type region 23, and a $p^+$ region may be formed on the inner peripheral side of the p-type region 23 (neither of these are illustrated in the figures).

The p-type region 23 is formed in the periphery of the active region and is formed in a voltage withstand structure that surrounds the active region. The voltage withstand structure is a region that maintains the withstand voltage. Moreover, the p-type region 23 is also formed in the side of the active region in which a diode device structure is formed and contacts a Schottky electrode 25 that forms a Schottky junction with the n-type SiC epitaxial layer 22. The Schottky electrode 25 will be described later. The p-type region 23 serves to prevent electric field concentration at the edges of the junction between the n-type SiC epitaxial layer 22 and the Schottky electrode 25 and also serves to further disperse the electric field in the periphery of the active region.

Above the voltage withstand structure, an interlayer insulating film 24 is formed covering the p-type region 23. Next, the Schottky electrode 25 (which forms an anode electrode) is formed on the same surface as the surface on which the interlayer insulating film 24 is formed. The Schottky electrode 25 is formed spanning from the active region to a portion of the voltage withstand structure.

More specifically, the Schottky electrode 25 is formed so as to cover the entire surface of the n-type SiC epitaxial layer 22 exposed in the active region and so as to contact the p-type region 23 in the periphery of the active region. Moreover, the Schottky electrode 25 is formed extending from the active region to the voltage withstand structure and extends onto the interlayer insulating film 24. Furthermore, the Schottky electrode 25 covers the p-type region 23 with the interlayer insulating film 24 interposed therebetween.

It is preferable that the Schottky electrode 25 be a single-layer film containing any one of Ti, Al, or Si, for example, or that the Schottky electrode 25 be a composite film containing two or three elements among Ti, Al, and Si. It is more preferable that the portion of the Schottky electrode 25 that forms a Schottky junction with the n-type SiC epitaxial layer 22 be made of Ti, for example.

An electrode pad 26 made of Al, for example, is formed on the Schottky electrode 25. The electrode pad 26 extends from the active region to the voltage withstand structure, and the edges of the electrode pad 26 furthest on the voltage withstand structure side are terminated above the Schottky electrode 25.

Furthermore, a protective film 27 such as a passivation film made of polyimide, for example, is formed covering the edges of the Schottky electrode 25 and the electrode pad 26 furthest on the voltage withstand structure side. This protective film 27 serves to prevent discharge.

Figure 8B:
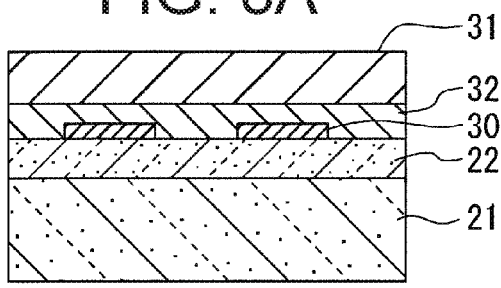

As illustrated in FIG. 8B, an adhesive 32 is applied to the front surface of the SiC substrate 21 in which the SBD structure 30 is formed, and a support substrate 31 is adhered thereto. For the adhesive 32 and the support substrate 31, materials that will not undergo any deformation or changes in properties that would affect the device in later process steps are selected. A glass substrate is used as the support substrate 31, for example. Moreover, a UV-curing resin is used as the adhesive 32. Using a UV-curing resin as the adhesive 32 makes it possible to cure the adhesive 32 by irradiating ultraviolet light through the glass substrate constituting the support substrate 31.

Figure 8C:
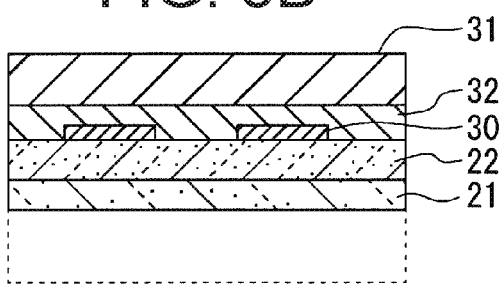

As illustrated in FIG. 8C, the rear surface of the SiC substrate 21 is removed with a grinding process to adjust the thickness of the SiC substrate 21 to 50 μm. Moreover, after the grinding process, if a damaged layer has developed on the rear surface of the SiC substrate 21 due to the process, the damaged layer may be removed by etching or the like.

Figure 8D:
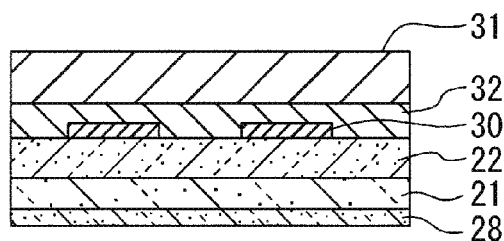

As illustrated in FIG. 8D, nitrogen ions are implanted as impurity ions in the rear surface of the SiC substrate 21, and then the nitrogen ion implantation surface is irradiated with an ultraviolet laser to form a high-concentration impurity layer 28. When implanting the nitrogen ions, the process is controlled such that the nitrogen ion implantation concentration in the region of up to a depth of 200 nm from the rear surface of the SiC substrate 21 takes a uniform concentration profile of approximately $3 \times 10^{19}$ cm$^{-3}$ in magnitude, for example, (see the impurity ion implantation concentration Yi in FIG. 2). During nitrogen ion implantation, the temperature of the stage (not illustrated in the figure) is set to room temperature. The high-concentration impurity layer 28 formed by irradiating with an ultraviolet laser has a first concentration peak in nitrogen ions near the rear surface of the SiC substrate 21, and this first peak concentration Yp is greater than or equal to $1 \times 10^{20}$ cm$^{-3}$, for example. Laser annealing eliminates the need to heat treat the entire SiC substrate 21, thereby avoiding any thermal effects on the support substrate 31 or the adhesive 32.

Figure 8E:
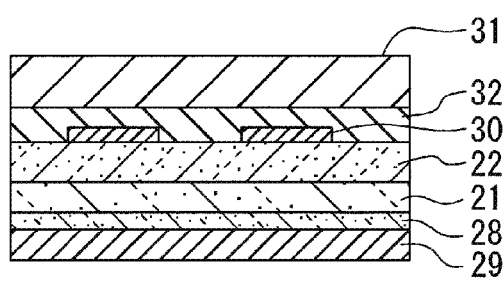

As illustrated in FIG. 8E, a metal film is sputtered onto the rear surface of the SiC substrate 21 (the surface of the high-concentration impurity layer 28) to form a rear surface electrode 29. Here, if any carbon has precipitated out onto the surface of the high-concentration impurity layer 28, it is preferable that the precipitated carbon be removed by plasma ashing or the like prior to forming the rear surface electrode 29.

Figure 8F:
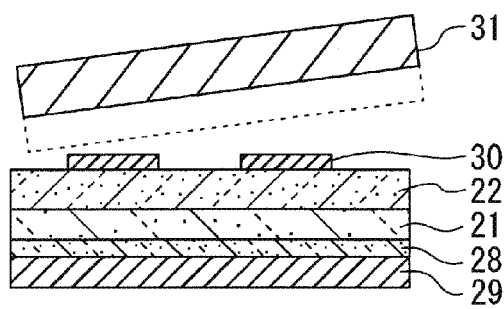

Finally, as illustrated in FIG. 8F, the adhesive 32 is removed and the support substrate 31 is separated and removed from the layered structure. The above makes it possible to form the SBD device 20 of Working Example 1.

Working Example 2

In Working Example 2, a MOS device in which a MOS structure is formed on the front surface of an SiC substrate and a high-concentration impurity layer and ohmic electrode as described in the embodiment are formed on the rear surface of the SiC substrate will be described.

Figure 9:
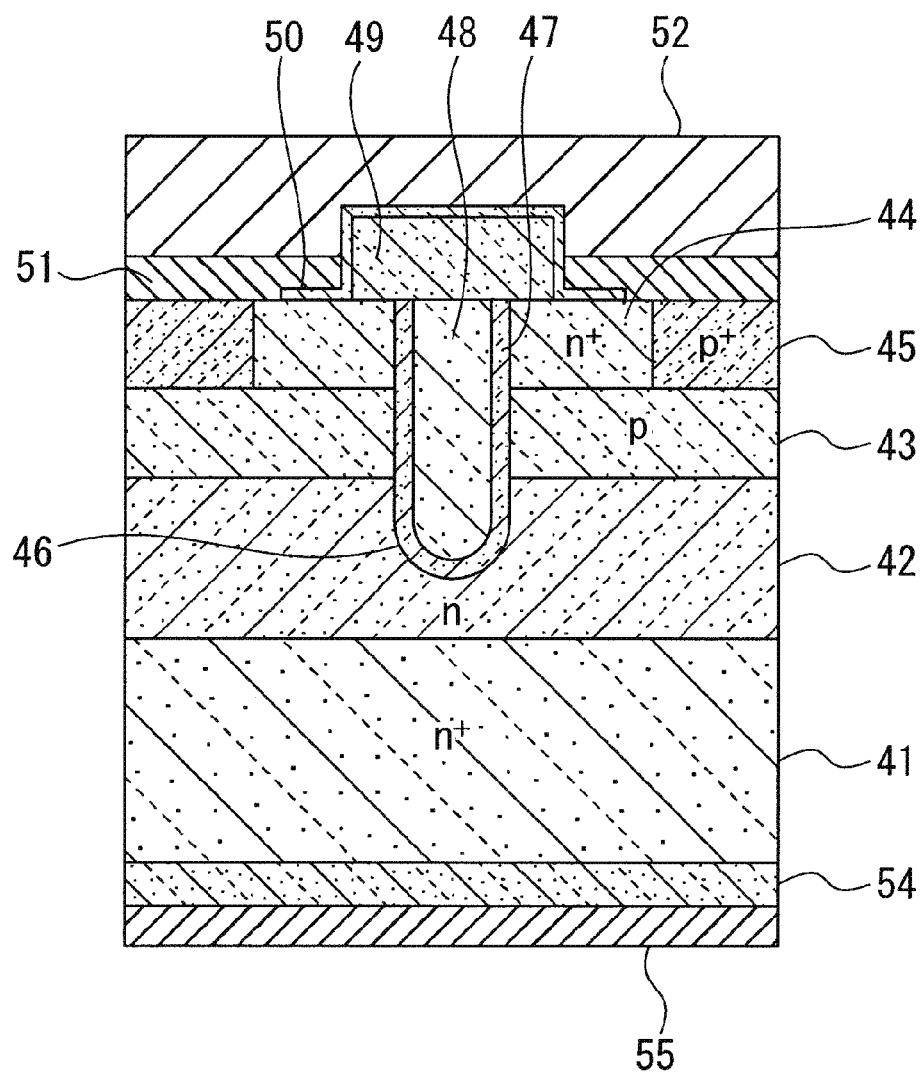
FIG. 9 is a cross-sectional view schematically illustrating an example configuration of a semiconductor device according to Working Example 2 of the present invention.

FIG. 9 is a cross-sectional view schematically illustrating the configuration of a MOS device 40, which is a semiconductor device according to Working Example 2. As illustrated in FIG. 9, the MOS device 40 of Working Example 2 includes an n$^+$ SiC substrate 41 and an n-type SiC epitaxial layer (drift layer) 42 deposited on one surface of the n$^+$ SiC substrate 41. The MOS device 40 further includes a base region (pSiC) 43 formed in the surface of the n-type SiC epitaxial layer 42 on the side opposite to the n$^+$ SiC substrate 41 side, as well as an impurity region (n$^+$ SiC) 44 and an impurity region (p$^+$ SiC) 45 formed in an upper portion of the base region 43. Moreover, the MOS device 40 includes an interlayer insulating film 49 formed covering a portion of the impurity region (n$^+$ SiC) 44 as well as a barrier layer 50 which covers the interlayer insulating film 49. Furthermore, the impurity region (n$^+$ SiC) 44 and the impurity region (p$^+$ SiC) 45 contact a source contact layer 51 via contact holes formed in the barrier layer 50, and the MOS device 40 includes a front surface electrode 52 which covers the source contact layer 51 and the barrier layer 50. The MOS device 40 also includes a high-concentration impurity layer 54 and a rear surface electrode 55 on the rear surface side of the n$^+$ SiC substrate 41.

Next, the details of the MOS device 40 will be described while describing a method of manufacturing the MOS device 40 with reference to the cross-sectional process step views in FIGS. 10A to 10F. In FIGS. 10A to 10F, the base region 43, the impurity region (n$^+$ SiC) 44, the impurity region (p$^+$ SiC) 45, a trench 46, a gate insulating film 47, a gate electrode 48, the interlayer insulating film 49, the barrier layer 50, and the front surface electrode 52 are depicted as a MOS structure 53.

Figure 10A:
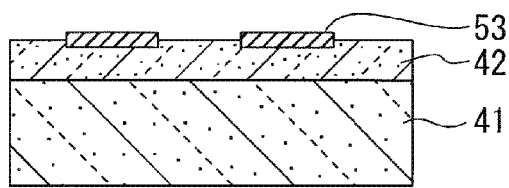
FIGS. 10A to 10F are cross-sectional views schematically illustrating an example of a method of manufacturing the semiconductor device according to Working Example 2 of the present invention.

As illustrated in FIG. 10A, an n-type SiC epitaxial layer 42 with a thickness of 10 μm is formed by being epitaxially grown on the front surface of an n$^+$ SiC substrate 41. The n$^+$ SiC substrate 41 and the n-type SiC epitaxial layer 42 have the same configuration as the n+ SiC substrate 21 and the n-type SiC epitaxial layer 22 of Working Example 1. The n-type SiC epitaxial layer 42 functions as a low impurity concentration n-type drift layer formed by doping with nitrogen, for example, to a lower impurity concentration than the n+ SiC substrate 41.

Next, a base region (pSiC) 43 containing p-type impurity ions is formed above the n-type SiC epitaxial layer 42 by implanting p-type impurity ions or by performing an ion epitaxial growth process in an atmosphere containing p-type impurities.

Then, using photolithography and an n-type impurity ion implantation process or the like, an impurity region (n+ SiC) 44 implanted with a high concentration of n-type impurities and an impurity region (p+ SiC) 45 implanted with a high concentration of p-type impurities are selectively formed in an upper portion of the base region 43. The impurity region (n+ SiC) 44 functions as a source region, and the impurity region (p+ SiC) 45 functions as a base contact region.

Next, using photolithography and a dry etching process such as reactive ion etching (RIE) or the like, a trench 46 is selectively formed going from an opening defined in the upper surface of the impurity region (n+ SiC) 44 down through the impurity region (n+ SiC) 44 and the base region (pSiC) 43, with the bottom of the trench 46 reaching an upper portion of the n-type SiC epitaxial layer 42 (drift layer).

Then, using a thermal oxidation process, a thermal oxidation film is formed on the bottom surface and side surfaces of the trench 46 as well as on the upper surface of the impurity region (n+ SiC) 44. Using photolithography and a wet etching process or the like, the thermal oxidation film is then removed in locations other than the bottom surface and side surfaces of the trench 46. In this way, a gate insulating film 47 (thermal oxidation film) is formed within the trench 46.

Next, using a chemical vapor deposition (CVD) process and an etch-back process or the like, the trench 46 is filled with polysilicon to form a gate electrode 48. Then, using CVD or the like, an insulating film such as an $SiO_2$ film is deposited on the upper surfaces of the gate electrode 48, the source region (n+ SiC) 44, and the base contact region (p+ SiC) 45.

Next, using photolithography and dry etching or the like, an insulating film layer is selectively formed on the gate insulating film 47 and the gate electrode 48 to form an interlayer insulating film 49, and a contact hole is formed therein. This contact hole exposes a portion of the source region (n+ SiC) 44 as well as the base contact region (p+ SiC) 45.

Then, a TiN thin film is formed as a barrier layer 50 on a portion of the source region (n+ SiC) 44 and on the interlayer insulating film 49. Next, a source contact layer 51 made of Ni or a metal containing Ni is formed on a portion of the source region (n+ SiC) 44 as well as on the base contact region (p+ SiC) 45 and the barrier layer 50, and a silicide annealing process is performed to form an ohmic contact. This silicide annealing process can be performed using a conventional technology such as atmospheric annealing, but any effects on the gate structure must be minimized.

Then, using sputtering or vacuum deposition or the like, a metal film made of Al or the like is deposited on the barrier layer 50 to form a front surface electrode 52. This front surface electrode 52 functions as a source electrode. In this way, a MOS structure 53 is formed in the front surface of the SiC substrate 41.

Figure 10B:
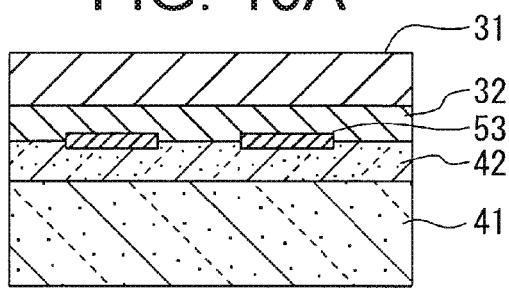
Figure 10C:
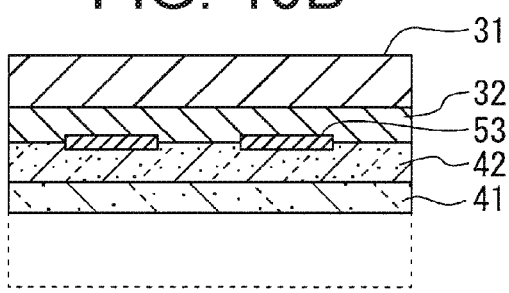
Figure 10D:
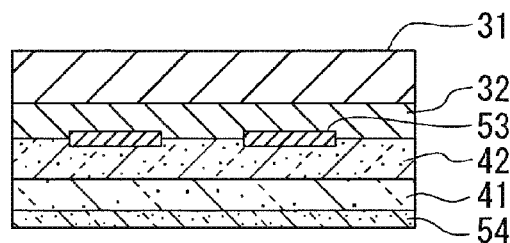
Figure 10E:
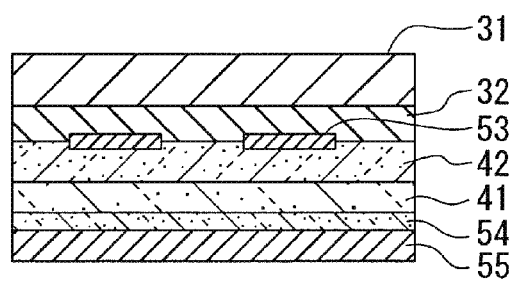
Figure 10F:
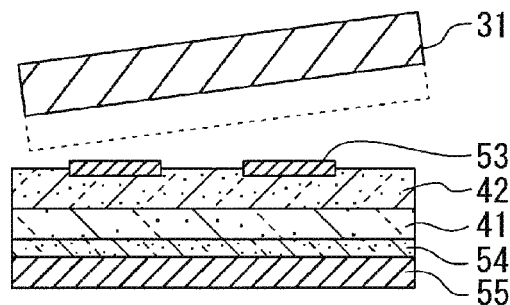

As illustrated in FIG. 10B, an adhesive 32 is applied to the front surface of the SiC substrate 41 in which the MOS structure 53 is formed, and a support substrate 31 is adhered thereto. Next, a grinding process step (FIG. 10C), high-concentration impurity layer 54 formation step (FIG. 10D), rear surface electrode 55 formation step (FIG. 10E), and support substrate 31 separation and removal step (FIG. 10F) are performed in the same manner as in FIGS. 8C to 8F of Working Example 1. The high-concentration impurity layer 54 functions as a drain region and has a first concentration peak in nitrogen ions, for example, near the rear surface of the SiC substrate 41. The first peak concentration Yp is greater than or equal to $1 \times 10^{20}$ cm$^{-3}$, for example. The rear surface electrode 55 functions as a drain electrode. The above makes it possible to form the MOS device 40 of Working Example 2.

Note that although in Working Example 2 the method of manufacturing according to the present embodiment was described as being applied during formation of the high-concentration impurity layer 54 as an example, the method of manufacturing according to the present embodiment may also be applied during formation of the source region 44. In this case, it is necessary to utilize laser annealing in order to avoid any effects on the fine-structured MOS structure 53 in the vicinity of the source region 44. Moreover, although in the description above the method of manufacturing according to the embodiment was described as being applied during formation of the high-concentration impurity layer 54 that functions as a drain region and is formed on the rear surface side of a trench-structure MOS device 40 as an example, the method of manufacturing according to the present embodiment may also be applied to a planar-structure MOS device.

Working Example 3

In Working Example 3, an IGBT device in which a MOS structure is formed on the front surface of an SiC substrate and a high-concentration impurity layer and ohmic electrode as described in the embodiment are formed on the rear surface of the SiC substrate will be described. The IGBT device according to Working Example 3 has substantially the same configuration as the MOS device 40 according to Working Example 2 but differs in that p-type impurities are implanted as impurity ions in the high-concentration impurity layer 54. Moreover, the IGBT device according to Working Example 3 is also different from the MOS device 40 according to Working Example 2 in that the impurity region (n+ SiC) 44 functions as an emitter region and the front surface electrode 52 functions as an emitter electrode, as well as in that the high-concentration impurity layer 54 functions as a collector region and the rear surface electrode 55 functions as a collector electrode.

An n-type SiC epitaxial layer 42 with a thickness of 40 μm is formed by being epitaxially grown on the front surface of an n+ SiC substrate 41. The n+ SiC substrate and the n-type SiC epitaxial layer have the same configuration as the n+ SiC substrate 41 and the n-type SiC epitaxial layer 42 of Working Example 2. Next, similar to in the MOS device 40 of Working Example 2, a MOS gate structure including a base region (pSiC), an emitter region, a base contact region, a trench, a gate insulating film, a gate electrode, and the like; an interlayer insulating film; a barrier layer; and a front surface electrode are formed on the n-type SiC epitaxial layer. In this way, a MOS structure is formed on the front surface of the SiC substrate.

Next, the rear surface of the SiC substrate is removed with a grinding process to adjust the thickness of the SiC substrate to 40 μm. Moreover, after the grinding process, if a damaged layer has developed on the rear surface of the SiC substrate 41 due to the process, the damaged layer may be removed by etching or the like.

Aluminum ions (p-type impurities) are implanted as impurity ions in the rear surface of the SiC substrate, and then the aluminum ion implantation surface is irradiated with an ultraviolet laser to form a high-concentration impurity layer. When implanting the aluminum ions, the process is controlled such that the aluminum ion implantation concentration in the region of up to a depth of 300 nm from the rear surface of the SiC substrate takes a uniform concentration profile of approximately $1 \times 10^{20}$ cm$^{-3}$ in magnitude, for example. During aluminum ion implantation, the temperature of the stage (not illustrated in the figures) is set to a temperature of 300° C. The high-concentration impurity layer formed by irradiating with an ultraviolet laser has a first concentration peak in aluminum ions near the rear surface of the SiC substrate.

Next, a metal film is sputtered onto the rear surface of the SiC substrate to form a rear surface electrode. Finally, an adhesive is removed and a support substrate is separated and removed from the layered structure. The above makes it possible to form the IGBT device of Working Example 3.

Note that although in Working Example 3 the method of manufacturing according to the present embodiment was described as being applied during formation of the collector region as an example, the method of manufacturing according to the present embodiment may also be applied during formation of the emitter region. In this case, it is necessary to utilize laser annealing in order to avoid any effects on the fine-structured MOS structure in the vicinity of the emitter region. Moreover, although in the description above the method of manufacturing according to the embodiment was described as being applied to the high-concentration impurity layer that functions as a collector region and is formed on the rear surface side of a trench-structure IGBT device as an example, the method of manufacturing according to the present embodiment may also be applied to a planar-structure IGBT device.

<Effects>

The semiconductor devices according to the embodiments make it possible to achieve advantageous effects such as the following.

(1) Due to enabling an impurity layer having a higher concentration than the concentration of implanted impurities to be formed in the surface region of a semiconductor substrate, ohmic contact can be achieved between the semiconductor substrate and an electrode made of metal without having to form a silicide layer between the semiconductor substrate and the electrode.

(2) Eliminating the need to form a silicide layer between the semiconductor substrate and the electrode makes it possible to prevent non-uniform silicide layer formation and the resulting reduction in contact area and increase in contact resistance between the semiconductor substrate and the silicide layer, thereby decreasing the contact resistance between the semiconductor substrate and the electrode.

(3) Annealing with a laser of a wavelength in the ultraviolet region makes it possible to efficiently transmit laser energy to the impurity ion-implanted region of the SiC substrate, thereby making it possible to form impurity concentration profiles that would be difficult to form with atmospheric annealing.

(4) When an SiC substrate is used as the semiconductor substrate, even if carbon precipitates out during manufacture of the semiconductor device, that precipitated carbon can be removed prior to forming the electrode, thereby making it possible to improve adhesion between the semiconductor substrate and the electrode and to prevent separation of the electrode from the semiconductor substrate.

(5) Annealing with a laser of a wavelength in the ultraviolet region eliminates the need to anneal the entire semiconductor substrate, thereby making it possible to avoid thermal effects on the semiconductor substrate or fine-structured semiconductor structures (SBD structure, MOS structure, etc.).

(6) Due to being able to anneal locally with a laser of a wavelength in the ultraviolet region, a support substrate for reducing the thickness of the semiconductor substrate can be used, and a high-concentration impurity layer can be formed while avoiding any thermal effects on that support substrate.

Other Embodiments

Although the invention according to the present application was described with reference to the embodiments above, the descriptions and drawings of this disclosure should not be understood to limit the present invention in any way. It should instead be understood that various alternative embodiments, examples, and applied technologies would be apparent from this disclosure to a person skilled in the art.

The structures of the semiconductor devices according to the present application are not limited to those described above and can be modified as appropriate in accordance with the desired specifications. For example, the use of the support substrate in the methods of manufacturing a semiconductor device illustrated in FIGS. 8A to 8F and FIGS. 10A to 10F is only an example, and the semiconductor devices may be manufactured using other techniques during semiconductor fabrication.

As described above, the invention according to the present application includes various other embodiments and the like that are not explicitly described in the embodiments and working examples above, and the technical scope of the invention according to the present application is defined only by the characterizing features of the invention as set forth in the claims, which are appropriately derived from the descriptions of the embodiments and working examples above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a semiconductor device, comprising:
   implanting impurity ions in one surface of a semiconductor substrate made of silicon carbide;
   irradiating a region of the semiconductor substrate implanted with the impurity ions with laser light of a wavelength in an ultraviolet region to form a high-concentration impurity layer; and forming, on a surface of the high-concentration impurity layer formed by irradiating with the laser light, an electrode made of metal in ohmic contact with the high-concentration impurity layer, wherein in the step of irradiating with the laser light, a first concentration peak of the impurity ions that exceeds a solubility limit concentration of the impurity ions in silicon carbide is formed in a surface region near the one surface of the semiconductor substrate within the high-concentration impurity layer, wherein the surface region is a region formed at a depth up to 100 nm from the one surface of the semiconductor substrate, wherein in the step of irradiating with the laser light, a diffusion region that is deeper than and abutting the surface region of the semiconductor substrate is further formed, wherein a concentration of the impurity ions in the diffusion region is less than the solubility limit concentration, and wherein in the step of irradiating with the laser light, a second concentration peak of the impurity ions that is less than the solubility limit concentration of the impurity ions is formed in the diffusion region.

2. The method of manufacturing a semiconductor device according to claim 1, wherein in the step of implanting the impurity ions, the impurity ions are implanted in the surface region and in the diffusion region.

3. The method of manufacturing a semiconductor device according to claim 1, wherein in the step of irradiating with the laser light, the first concentration peak is formed by irradiating with laser light that reaches the diffusion region so as to change a concentration profile of the impurity ions established in the surface region and the diffusion region prior to irradiating with the laser light.

4. The method of manufacturing a semiconductor device according to claim 1, wherein in the step of implanting the impurity ions, ions containing one or more elements selected from among nitrogen (N), phosphorus (P), aluminum (Al), boron (B), silicon (Si), carbon (C), and beryllium (Be) are used as the impurity ions.

5. The method of manufacturing a semiconductor device according to claim 4,
wherein in the step of implanting the impurity ions, nitrogen ions are used as the impurity ions, and
wherein by irradiating with the laser light, the first concentration peak greater than or equal to $1 \times 10^{20}$ cm$^{-3}$ is formed in the surface region in the high-concentration impurity layer.

6. The method of manufacturing a semiconductor device according to claim 5, wherein in the step of implanting the impurity ions, the nitrogen ions are implanted at a concentration of $1 \times 10^{19}$ cm$^{-3}$ to $5 \times 10^{19}$ cm$^{-3}$.

7. The method of manufacturing a semiconductor device according to claim 4,
wherein in the step of implanting the impurity ions, phosphorus ions are used as the impurity ions, and
wherein by irradiating with the laser light, the first concentration peak greater than or equal to $5 \times 10^{20}$ cm$^{-3}$ is formed in the surface region in the high-concentration impurity layer.

8. The method of manufacturing a semiconductor device according to claim 7, wherein in the step of implanting the impurity ions, the phosphorus ions are implanted at a concentration of $1 \times 10^{20}$ cm$^{-3}$ to $3 \times 10^{20}$ cm$^{-3}$.

9. The method of manufacturing a semiconductor device according to claim 1, wherein the wavelength of the laser light is 190 nm to 388 nm.

10. The method of manufacturing a semiconductor device according to claim 1, wherein an irradiation energy density of the laser light is 2 J/cm$^2$ to 6 J/cm$^2$.

11. A semiconductor device, comprising:
a semiconductor substrate made of silicon carbide;
a drain region or collector region containing impurity ions and formed in and near one surface of the semiconductor substrate; and
an electrode formed on a surface of the drain region or collector region, the electrode being made of metal and in ohmic contact with the drain region or collector region,
wherein the drain region or collector region has, in a surface region formed near the one surface of the semiconductor substrate, a first concentration peak of the impurity ions that exceeds a solubility limit concentration of the impurity ions in silicon carbide,
wherein the surface region is a region formed at a depth up to 100 nm from the one surface of the semiconductor substrate,
wherein the drain region or collector region further has a diffusion region that is deeper than and abutting the surface region of the semiconductor substrate,
wherein a concentration of the impurity ions in the diffusion region is less than the solubility limit concentration, and
wherein the drain region or collector region has, in the diffusion region, a second concentration peak of the impurity ions that is less than the solubility limit concentration.

12. The semiconductor device according to claim 11, wherein the impurity ions are ions containing one or more elements selected from among nitrogen (N), phosphorus (P), aluminum (Al), boron (B), silicon (Si), carbon (C), and beryllium (Be).

13. The semiconductor device according to claim 12,
wherein the impurity ions are nitrogen ions, and
wherein a concentration of the nitrogen ions at the first concentration peak is greater than or equal to $1 \times 10^{20}$ cm$^{-3}$.

14. The semiconductor device according to claim 13, wherein a concentration of the nitrogen ions in the diffusion region is greater than or equal to $1 \times 10^{19}$ cm$^{-3}$.

15. The semiconductor device according to claim 12,
wherein the impurity ions are phosphorus ions, and
wherein a concentration of the phosphorus ions at the first concentration peak is greater than or equal to $5 \times 10^{20}$ cm$^{-3}$.

16. The semiconductor device according to claim 15, wherein a concentration of the phosphorus ions in the diffusion region is greater than or equal to $5 \times 10^{19}$ cm$^{-3}$.

* * * * *